United States Patent
Ruth, Jr. et al.

[11] Patent Number: 6,084,471
[45] Date of Patent: Jul. 4, 2000

[54] SOFT-LIMITING CONTROL CIRCUIT FOR VARIABLE GAIN AMPLIFIERS

[75] Inventors: Robert N. Ruth, Jr., San Diego; John Groe, Poway; Damian Costa; Roy Enright, both of San Diego, all of Calif.

[73] Assignee: Nokia Mobile Phones, Espoo, Finland

[21] Appl. No.: 08/995,058

[22] Filed: Dec. 19, 1997

[51] Int. Cl.[7] .................................................. H03F 3/45
[52] U.S. Cl. ..................... 330/254; 327/346; 330/257; 330/300; 330/310
[58] Field of Search ................... 330/254, 256, 330/279, 257, 300, 310, 311; 327/346; 455/241.1, 246.1

[56] References Cited

U.S. PATENT DOCUMENTS

| | | | |
|---|---|---|---|
| 4,101,841 | 7/1978 | Okada et al. | 330/254 |
| 4,413,235 | 11/1983 | Jason | 330/254 |
| 4,514,702 | 4/1985 | Zogg | 330/254 |
| 4,580,287 | 4/1986 | Richards, Jr. | 455/226 |
| 4,769,588 | 9/1988 | Panther | 330/254 X |
| 4,963,836 | 10/1990 | Noguchi et al. | 330/254 |
| 5,134,722 | 7/1992 | Emslie et al. | 455/249.1 |
| 5,198,780 | 3/1993 | Kase | 330/254 |
| 5,256,984 | 10/1993 | Lee | 330/254 |
| 5,278,518 | 1/1994 | Debroux | 330/279 |
| 5,283,536 | 2/1994 | Wheatley, III et al. | 330/279 |
| 5,389,893 | 2/1995 | Itri et al. | 330/254 |
| 5,451,901 | 9/1995 | Welland | 330/133 |
| 5,467,057 | 11/1995 | Joardar | 330/254 |
| 5,469,106 | 11/1995 | Dow | 330/254 |
| 5,477,191 | 12/1995 | Demicheli | 330/254 |
| 5,515,004 | 5/1996 | Alford et al. | 330/254 |
| 5,528,197 | 6/1996 | Frey | 330/254 |
| 5,572,166 | 11/1996 | Gilbert | 330/254 |

*Primary Examiner*—Steven J. Mottola
*Attorney, Agent, or Firm*—Brown, Martin Haller & McClain

[57] ABSTRACT

The input AGC and reference (REF) voltages are converted to currents and provided as differential inputs to a current amplifier. The current amplifier scales these currents proportional to absolute temperature. The translinear principle is used to realize the current amplifier and ensures linearity of the differential output currents. These currents are then converted to voltages by resistor elements. The result is applied to a simple differential pair that produces two AGC control currents that follow the hyperbolic tangent function. The two AGC control currents are equal when the AGC input is three-fourths the reference value. The overall gain response is well modeled by a second order function and is self-limiting at high gain values.

17 Claims, 3 Drawing Sheets

SOFT-LIMITING CONTROL CIRCUIT FOR VARIABLE GAIN AMPLIFIERS

FIELD OF THE INVENTION

This invention relates generally to variable gain amplifiers (VGA), and more specifically to an automatic gain control (AGC) circuit which provides control for a variable gain amplifier.

BACKGROUND OF THE INVENTION

Automatic gain control (AGC) circuits are widely used in receivers for controlling the gain applied to a signal to be processed. In wireless communications, including mobile phones, communication signals are received via a receiver and then amplified for use in signal processing. Because the received signals often vary in signal strength, variable gain must be provided to allow the signal processor to recover the information within the signal. For example, in a code division multiple access (CDMA) system, the signal of interest has a large bandwidth, and it is necessary to limit the total power of the received signal for proper signal processing. Further, because the digital modulation technique of the CDMA system utilizes linear signal processing, the AGC circuits must prevent amplitude distortion of the signal.

A typical AGC circuit includes a variable gain amplifier (VGA) in a loop structure, a signal level detector, a control generator driven by the signal level detector and a stabilizing capacitor. In a CDMA system, the control of the VGA is set by the AGC loop, or is manually adjusted based upon externally received information. Hence, the performance of the control generator is key to the AGC loop in a CDMA system.

A commonly used means within wireless communications technologies for controlling the gain is the exponential (dB-linear) amplifier, in which the output of the amplifier is proportional to the exponential of the input voltage. As illustrated in FIG. 1, control current $I_X$ from current source 1 flows entirely through feedback transistor $Q_1$. The fundamental relationship for the collector current of $Q_1$ is:

$$I_X = I_S \left( \exp\left(-\frac{V_O}{V_T}\right) - 1 \right) \quad (1)$$

where $V_T = KT/q$ and $V_O$ is the output voltage from operational amplifier 2. Using a similar expression for transistor $Q_2$, $$I_O = I_S \exp\left(\frac{V - V_O}{V_T}\right). \quad (2)$$

Comparing the two currents, $I_X$ and $I_O$ yields:

$$\frac{I_O}{I_X} = \frac{I_S \exp\left(\frac{V - V_O}{V_T}\right)}{I_S \exp\left(-\frac{V_O}{V_T}\right)} \quad (3)$$

which simplifies to:

$$I_O = I_X \exp\left(\frac{V}{V_T}\right). \quad (4)$$

As can be seen from Equation 4, the output current is affected by the temperature of the transistor $Q_1$. It then becomes necessary to adjust the input voltage V to compensate for temperature changes in the thermal voltage, $V_T$. Any error adjusting the input voltage V is magnified by the exponential function and leads to larger gain errors associated with the variable gain amplifier.

SUMMARY OF THE INVENTION

It is an advantage of the present invention to provide a circuit for combining gain control with a hyperbolic tangent function as a means for control of a variable gain amplifier.

In an exemplary embodiment, the input AGC and reference (REF) voltages are converted to currents. The AGC current is duplicated and subtracted from the reference current yielding a complimentary pair of currents, $I_{AGC}$ and $I_{REF} - I_{AGC}$. By design, these currents are equal when the input AGC voltage equals three-fourths the reference voltage. The complimentary currents are applied to a current amplifier having a gain that is proportional to absolute temperature. The output currents are connected to current mirrors that direct their outputs to resistor elements. The differential voltage developed across the resistor elements is applied to a simple bipolar differential pair. These linear input voltages are translated to output control currents that follow a hyperbolic tangent function.

The output control currents are used to control a variable gain amplifier that also utilizes a bipolar differential pair. The overall gain response is well modeled by a second order function and is self-limiting at high gain values. The second order function can be corrected using software-based AGC algorithms that are known in the art.

BRIEF DESCRIPTION OF THE DRAWINGS

Understanding of the present invention will be facilitated by consideration of the following detailed description of preferred embodiments of the present invention taken in conjunction with the accompanying drawings, in which like numerals refer to like parts, and in which.

DETAILED DESCRIPTION OF A PREFERRED EMBODIMENT

Figure 3:
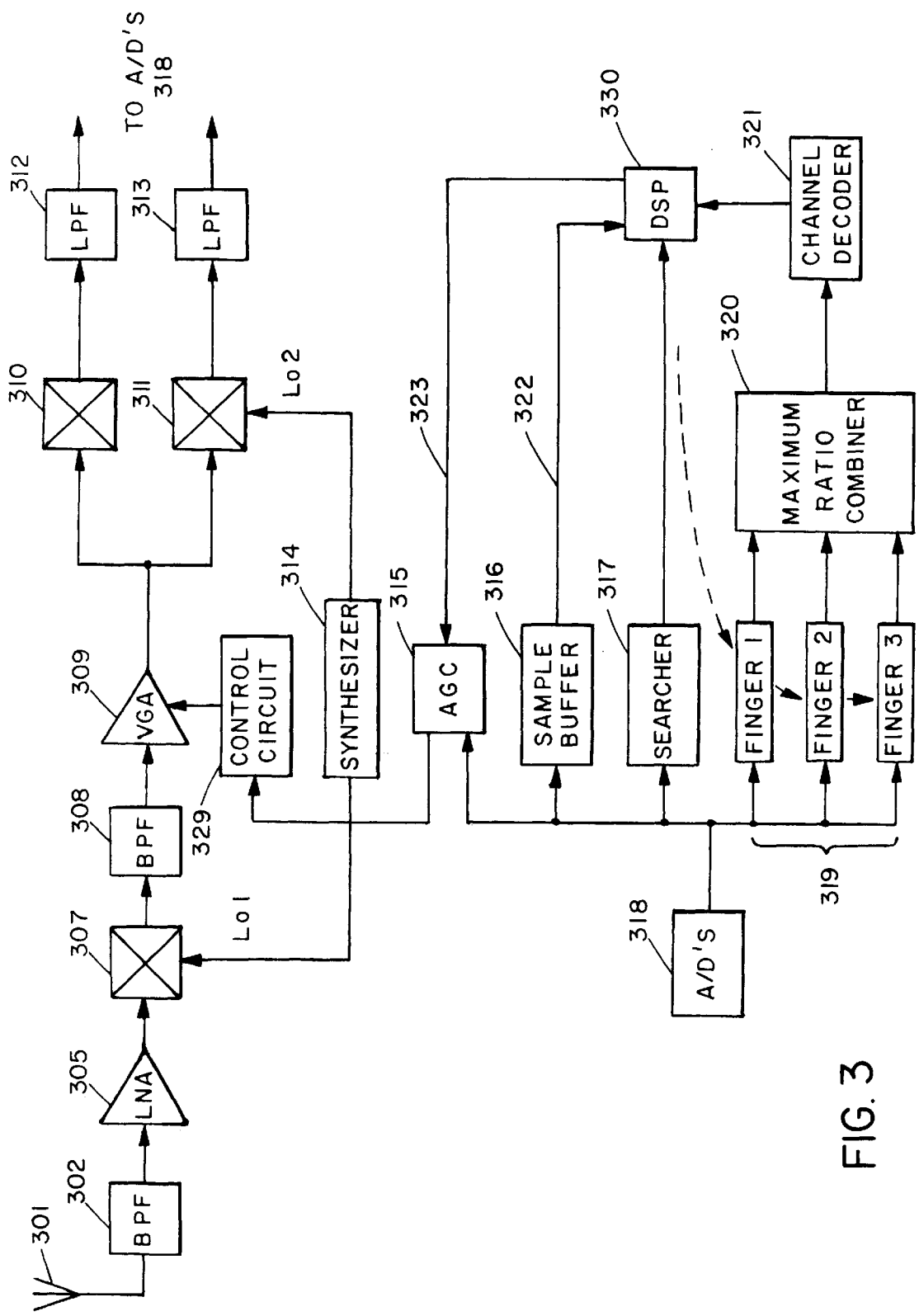
FIG. 3 is a block diagram of an exemplary receiver for the front end of a mobile phone which includes AGC according to the present invention.

To provide an overview of an application of the control circuit of the present invention, FIG. 3 provides a block diagram of the architecture of an exemplary receiver of a mobile telephone in which the control circuit might be implemented. A transmitted signal is received at antenna 301 and passed through broad-band bandpass filter 302, which passes only receive channels from 869 to 894 MHZ to be considered for demodulation by the receiver (1930 to 1990 MHz for PCS 1900.) During initial start-up of the receiver, LNA 305 is set to high gain to facilitate signal location.

From LNA 305, the signal is coupled to mixer/local oscillator ($L_{O1}$) 307 which down-converts the received signal to a first intermediate frequency (IF) signal. The first IF signal is filtered through bandpass filter 308 and amplified by variable gain amplifier (VGA) 309 according to the control signal (feedback signal) provided by automatic gain controller (AGC) 315 via control circuit 329. From the output of VGA 309, the first IF signal is split and converted to a second IF signal at mixer/LOs 310,311 which is coupled through low pass filters (LPF) 312,313 to analog-to-digital converters (A/D) 318. Frequency synthesizer 314, which typically includes a crystal oscillator for frequency reference and a phase detector, generates a control voltage signal to adjust the frequency of LOs coupled to mixers 307, 310 and 311.

The digital output from A/Ds 318 is coupled to automatic gain control (AGC) block 315, PN searcher 317, and Rake demodulator 319 which has three parallel fingers, each of which includes a local PN generator. The outputs from the fingers of Rake demodulator 319 are summed at maximum ratio combiner 320 and passed to channel decoder block 321. From channel decoder block 321, the data is passed to the digital signal processor (DSP) 330 at a frame rate of 50 Hz. For ease of implementation and overall size reduction of the mobile phone, AGC block 315, sample buffer 316, searcher block 317, Rake demodulator 319, combiner 320 and channel decoder 321, and the connections (e.g., 322, 323) between various elements are preferably integrated onto an ASIC (application specific integrated circuit).

Acquisition of the I (in-phase) and Q (quadrature) signals from the received signal (RX) is performed in searcher block 317 by a phase demodulator integrated therein (not illustrated). The searcher block also includes a RAM, shown separately as sample buffer 316, within which the I and Q samples are stored. The searcher block 317 also includes an RSSI detector (not illustrated) which measures and provides a signal to DSP 330 indicative of received signal power.

AGC block 315 receives a control signal from DSP 330 by way of connection 323 for setting the gain of VGA 309. (It should be noted that the implementation of this connection is by the DSP 330 writing to a register which then passes the signal on to the AGC block, as is known in the art. For simplicity, the functional connection has been designated by reference numeral 323.) This control signal includes any software-generated correction for non-linearities introduced by the amplifiers in AGC block 315. AGC block 315 provides a signal that indicates the desired gain in linear dB. The dB value is converted to magnitude form by the control circuit 329 and is applied to the VGA 309.

Figure 1:
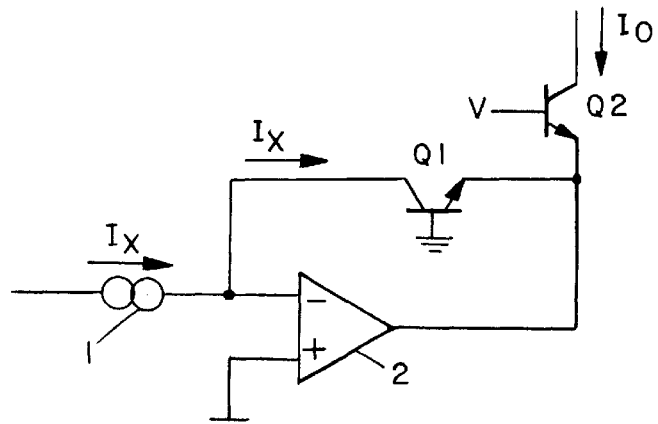
FIG. 1 is a circuit diagram of a prior art exponential amplifier.
Figure 2:
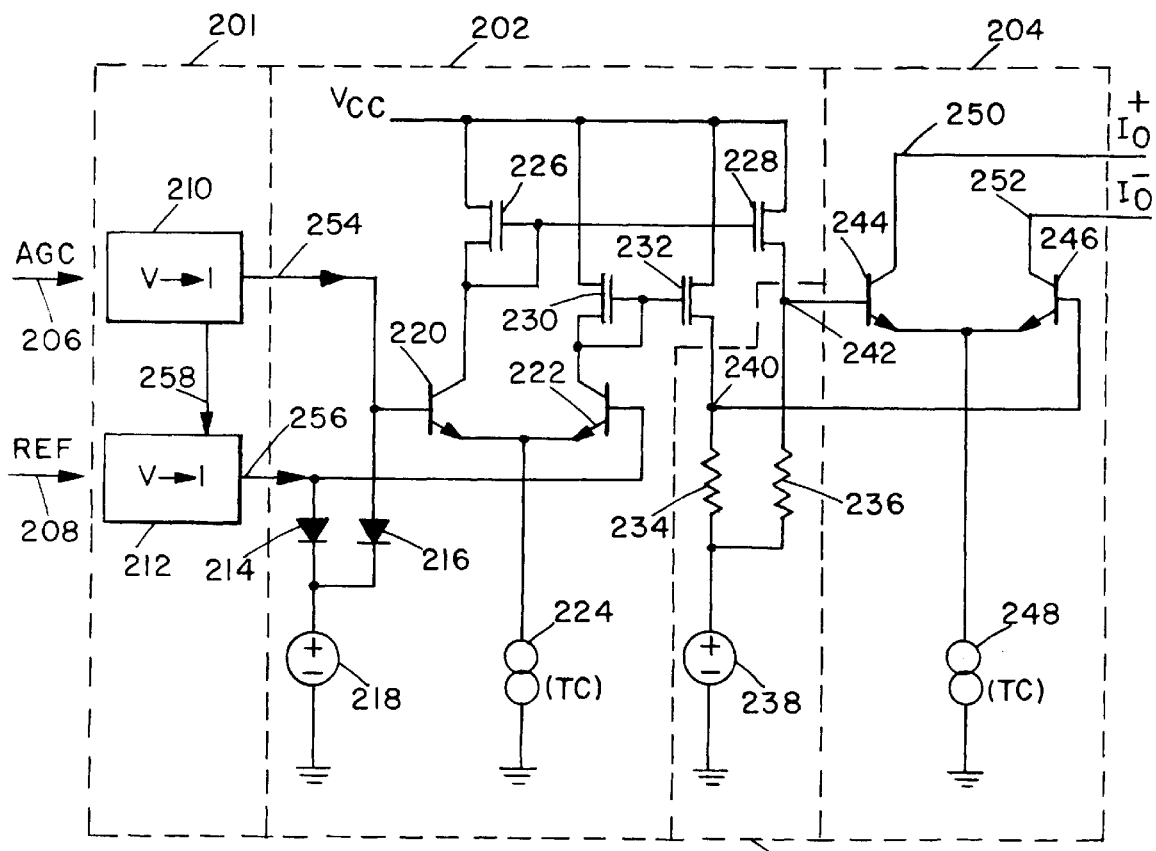
FIG. 2 is a circuit diagram of the control circuit of the present invention.
Figure 5A:
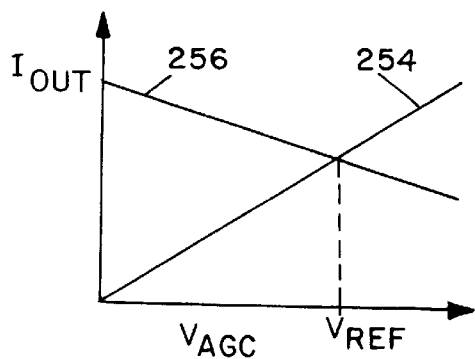
FIGS. 5a–5c are plots of input voltage versus output current or output voltage taken at the output of the Voltage to Current converters (FIG. 5a), taken prior to the simple differential pair (FIG. 5b), and taken at the outputs of the differential pair (FIG. 5c).

Using the example of the mobile phone receiver shown in FIG. 3, the improvement provided by the present invention resides in the control circuit 329, which provides a control signal for VGA 309. The circuit diagram illustrated in FIG. 2 provides the details of the control circuit 329. The control circuit 329 consists of a first stage: a voltage-to-current converter 201, a second stage: a current amplifier 202, a third stage: a current-to-voltage converter 203, and a fourth stage consisting of a differential amplifier 204. The input voltages 206, 208 are provided from, referring briefly back to FIG. 3, the AGC block 315. The reference signal 208 is the maximum available value of the AGC input. The input voltages 206 and 208 are converted to currents by voltage-to-current conversion stages 210 and 212, respectively, using circuitry that is well known in the art. The current $I_{AGC}$ 254 is duplicated 258 and subtracted from the current $I_{REF}$ to yield complimentary currents, $I_{AGC}$ 254 and $I_{REF}-I_{AGC}$ 256. The currents will be equal when the input voltage, AGC 206, is three-fourths the value of the reference voltage, REF 208. The output current curves from the voltage-to-current converters 210 and 212 versus the input AGC voltage 206 are shown in FIG. 5a.

Each of the input current signals is conducted to the current amplifier 202, which is based on the translinear principle. The complimentary input currents flow through forward-biased diodes 214 and 216 (bias provided by voltage source 218), creating a differential voltage given by $$\Delta V = V_T \ln\left(\frac{I_{REF} - I_{AGC}}{I_{AGC}}\right). \quad (5)$$

This voltage is applied to a first differential bipolar pair, which consists of transistors 220 and 222. The ratio of the output currents from transistors 220 and 222 will be identical to the ratio of currents in Equation 5, where $$\left(\frac{I_{REF} - I_{AGC}}{I_{AGC}}\right) \propto \left(\frac{I_{222}}{I_{220}}\right). \quad (6)$$

Equation 6 represents the translinear principle. The actual magnitudes of the collector currents, $I_{220}$ and $I_{222}$, from transistors 220 and 222 respectively, are dependant on the current source 224. The signal provided by current source 224 is proportional to absolute temperature T utilizing control means which are well known in the art. It follows that the ratio of output currents, $I_{220}$ and $I_{222}$, from the differential pair are $$\left(\frac{I_{222}}{I_{220}}\right) = \left(\frac{I_{224}}{I_{REF}}\right) = \left(\frac{I_{REF} - I_{AGC}}{I_{AGC}}\right). \quad (7)$$

The output currents $I_{220}$ and $I_{222}$ are linear because they are derived from the linear input currents 254, 256. Thus, $I_{220}$ and $I_{222}$ are scaled versions of $I_{REF}-I_{AGC}$ and $I_{AGC}$ and proportional to temperature. Two PMOS current mirrors consisting of FETs 226, 228, 230, and 232 are connected to the outputs of the first differential pair 220, 222. Bias voltage 218 level shifts the inputs of the first differential pair to operate the transistors 220, 222 and current source 224 in the linear region and out of saturation.

Figure 5B:
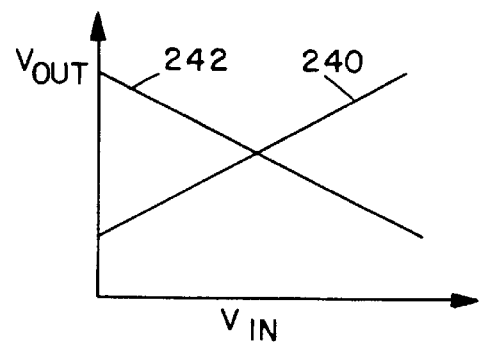

The output currents from the current amplifier 202 are connected to resistors 234 and 236 to develop linear voltages referenced to bias voltage 238. Bias voltage 238 level shifts the inputs to the second differential pair to operate the transistors 244, 252 and current source 248 in the linear region and out of saturation. The current-to-voltage converter 203 includes resistors 234, 236, and bias voltage 238. FIG. 5b illustrates the output voltages at nodes 240 and 242 as a function of the input AGC voltage 206.

Figure 5C:
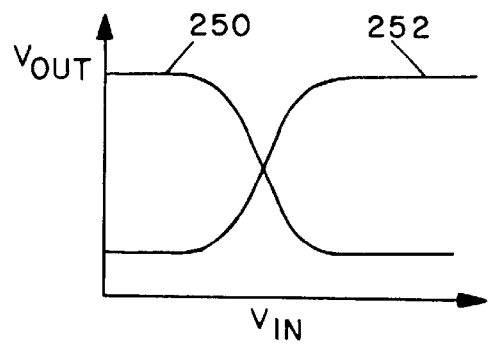

The fourth stage of the gain control circuit is the differential amplifier 204. The differential amplifier 204 consists of a second differential bipolar pair having transistors 244 and 246 which receive as base inputs the output voltages taken from nodes 242 and 240. The emitters of the transistors 244 and 246 are connected to a current source 248 that provides a signal that is proportional to absolute temperature T. The output currents, $I_o^+$ and $I_o^-$, which are used to provide gain control to the VGA 309 (referring to FIG. 3) are taken at nodes 250 and 252. The resulting curves of output current 250, 252 versus input AGC voltage 206 are provided in FIG. 5c.

The outputs of the differential amplifier 204 are control currents 250, 252 that map to the tanh function. The tanh function is based on the exponential function, $$\tanh(u) = \frac{e^u - e^{-u}}{e^u + e^{-u}}. \quad (8)$$

The function 1+tanh(u) behaves as an exponential for values of $u \leq \tanh^{-1}(-\frac{1}{2})$ and produces a linear dB relationship. It is desirable to use more of the tanh function and to move away from $u=-\infty$. However, if the domain is extended past $u=\tanh^{-1}(-\frac{1}{2})$, the function 1+tanh(u) deviates from an exponential response (linear dB relationship) and changes less quickly than would a comparable exponential function. It is important to note that it is possible to model the 1+tanh(u) function, with domain of u from $-\infty$ to $\tanh^{-1}(\frac{1}{2})$ by a second order equation, $au^2+bu+c$. The embodiment of this invention makes use of these principles by providing an exponential input-to-output relationship using the 1+tanh(u) function to translate dB to magnitude gain values, soft-limiting the 1+tanh(u) function for the domain $-\frac{1}{2}<u<\tanh^{-1}(\frac{1}{2})$, and modeling the 1+tanh(u) 25 function in the described domain $-\infty<u \leq \tanh^{-1}(\frac{1}{2})$ by a second order function. The AGC algorithms used to implement second order functions or other piece-wise linear functions are well known in the art.

Figure 4:
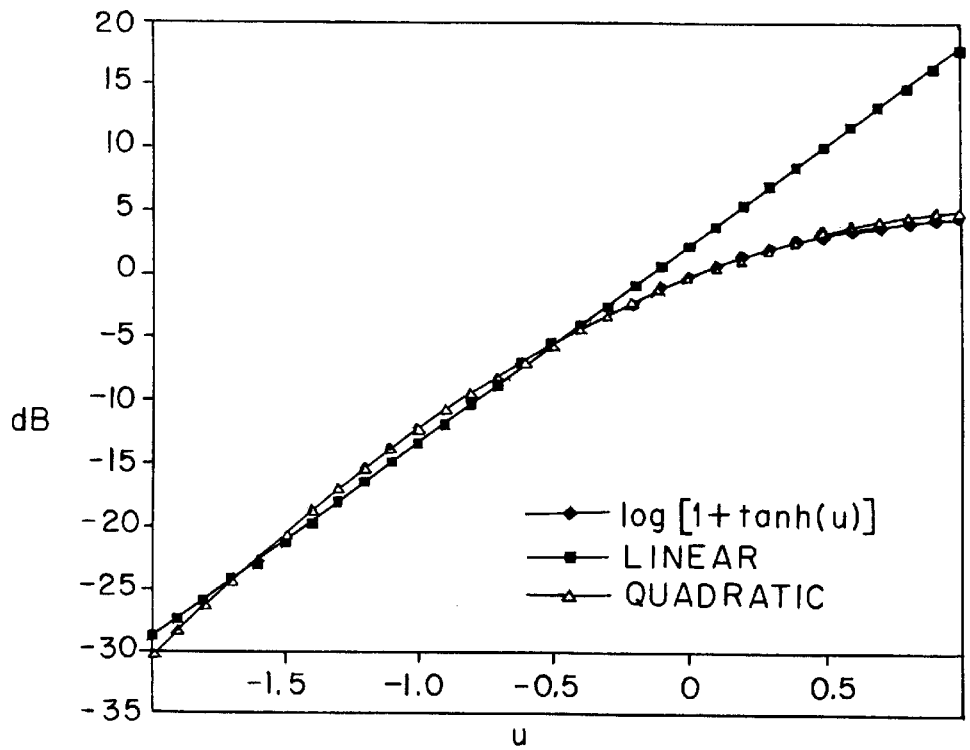
FIG. 4 is a plot of the tanh function output waveform.

The plot provided in FIG. 4 compares the log(tanh(u)) to the second order function $au^2+bu+c$ for the domain $-\infty$ to $\tanh^{-1}(\frac{1}{2})$. The error is less than ±0.4 dB over the described domain of u. Such error can be readily dealt with using software within DSP 330 of FIG. 3, or other appropriate processing means as are known in the art.

The three data points shown in Table 1 were used to generate the coefficients for $y=(au^2+bu+c)$.

TABLE 1

| u | log [1 + tanh(u)] |
|---|---|
| -1.7 | -23.95 |
| -0.6 | -6.70 |
| 0.5 | 3.25 |

Table 2 provides the data points which make up the curve in FIG. 4 plus the error between the measured and calculated values. The control circuit is intended to provide 30 dB gain variation. For the range of $-1.8 \leq u \leq 0.9$, the error is less than ±0.4 dB.

TABLE 2

| u | log [1 + tanh(u)] | linear | quadratic | Error |
|---|---|---|---|---|
| -2.0 | -28.88 | -28.88 | -29.92 | 1.04 |
| -1.9 | -27.18 | -27.31 | -27.87 | 0.69 |
| -1.8 | -25.48 | -25.75 | -25.88 | 0.40 |
| -1.7 | -23.80 | -24.18 | -23.95 | 0.15 |
| -1.6 | -22.12 | -22.62 | -22.08 | -0.04 |
| -1.5 | -20.46 | -21.05 | -20.27 | -0.19 |
| -1.4 | -18.81 | -19.48 | -18.52 | -0.29 |
| -1.3 | -17.19 | -17.92 | -16.83 | -0.35 |
| -1.2 | -15.58 | -16.35 | -15.20 | -0.38 |
| -1.1 | -14.00 | -14.78 | -13.64 | -0.37 |
| -1.0 | -12.45 | -13.22 | -12.13 | -0.33 |
| -0.9 | -10.94 | -11.65 | -10.68 | -0.26 |
| -0.8 | -9.47 | -10.09 | -9.29 | -0.18 |
| -0.7 | -8.05 | -8.52 | -7.97 | -0.09 |
| -0.6 | -6.69 | -6.95 | -6.70 | 0.01 |
| -0.5 | -5.39 | -5.39 | -5.49 | 0.11 |
| -0.4 | -4.15 | -3.82 | -4.35 | 0.20 |
| -0.3 | -2.99 | -2.25 | -3.26 | 0.27 |
| -0.2 | -1.91 | -0.69 | -2.24 | 0.33 |
| -0.1 | -0.91 | 0.88 | -1.27 | 0.36 |

TABLE 2-continued

| u | log [1 + tanh(u)] | linear | quadratic | Error |
|---|---|---|---|---|
| 0 | 0.00 | 2.45 | -0.37 | 0.37 |
| 0.1 | 0.83 | 4.01 | 0.48 | 0.35 |
| 0.2 | 1.56 | 5.58 | 1.26 | 0.30 |
| 0.3 | 2.22 | 7.14 | 1.98 | 0.24 |
| 0.4 | 2.80 | 8.71 | 2.65 | 0.15 |
| 0.5 | 3.30 | 10.28 | 3.25 | 0.05 |
| 0.6 | 3.73 | 11.84 | 3.79 | -0.06 |
| 0.7 | 4.11 | 13.41 | 4.27 | -0.17 |
| 0.8 | 4.42 | 14.98 | 4.70 | -0.27 |
| 0.9 | 4.69 | 16.54 | 5.06 | -0.37 |
| 1.0 | 4.92 | 18.11 | 5.36 | -0.44 |

The gain control circuit as described provides a simple means for obtaining the desired dB control for a variable gain amplifier without introducing the errors normally associated with conventional exponential functions.

Other embodiments and modifications of the present invention will occur readily to those skilled in the art in view of these teachings. Therefore, this invention is to be limited only by the following claims.

We claim:

1. A gain control circuit for generating a control signal for varying gain in a variable gain amplifier comprising:

a reference voltage source for generating a reference voltage;

a transconductance amplifier stage for converting an input voltage and the reference voltage into an input current and a reference current;

a translinear amplifier stage having inputs for receiving the input current and the reference current and for generating linear differential output voltage signals therefrom; and a differential pair for receiving the linear differential output voltage signals and generating control currents in response thereto, the control currents each following at least a portion of a hyperbolic tangent function defined by the function 1+tanh(u) having a domain $-\frac{1}{2}<u<\tanh^{-1}(\frac{1}{2})$ which approximates an exponential function.

2. The gain control circuit of claim 1, wherein the translinear amplifier stage comprises a current amplifier stage.

3. The gain control circuit of claim 1, wherein the translinear amplifier stage comprises an emitter-coupled bipolar transistor pair, each bipolar transistor of the pair having an emitter connected to a first temperature-compensated current bias.

4. The gain control circuit of claim 3, wherein the translinear amplifier stage includes one PMOS current mirror connected to an output of each bipolar transistor of the emitter-coupled bipolar pair.

5. The gain control circuit of claim 4, wherein the PMOS current mirror comprises a gate-coupled FET pair, each transistor of the FET pair having a gate, a drain and a source, the drains being connected to a supply voltage, a first FET of the pair having its gate tied to its source.

6. The gain control circuit of claim 5, wherein the PMOS current mirror generates a linear current output, and the linear current output is voltage referenced across a resistor to generate one of the linear differential output voltage signals.

7. The gain control circuit of claim 3, wherein the translinear amplifier further includes a forward-biased diode connected to each of the inputs of the translinear amplifier stage for developing differential exponential voltage signals for input to the emitter-coupled bipolar pair.

8. The gain control circuit of claim 1, further comprising a digital signal processor means for running software-based corrections to correct for errors introduced by the hyperbolic tangent function for the domain $-\infty < u < \tanh^{-1}(\frac{1}{2})$.

9. An automatic gain controller for providing control currents to a variable gain amplifier comprising:

an input voltage source for providing an input voltage;

a reference voltage source for providing a first reference voltage;

a first voltage-to-current converter for converting the input voltage to an input current;

a second voltage-to-current converter for converting the reference voltage to a reference current and for generating a difference current therefrom, the difference current being a difference between the input current and the reference current;

a first emitter-coupled bipolar pair comprising two bipolar transistors, each having a base, a collector and an emitter, the base of a first bipolar transistor of the two bipolar transistors connected to the input current, the base of the second bipolar transistor connected to the difference current, the coupled emitters connected to a first temperature-compensated bias current source;

a PMOS current mirror connected to the collector of each bipolar transistor for generating linear current outputs, the PMOS current mirror comprising a gate-coupled FET pair, each FET of the pair having a gate, a drain and a source, each FET being connected at its drain to a source voltage, one FET of the pair having its gate connected to its source and the other FET having its source connected to a resistor so that the linear current outputs are converted to linear differential voltages;

two first output nodes connected to the sources of the FET pair;

a second emitter-coupled bipolar pair having two bases, each base being connected to one of the two first output nodes, the second bipolar pair being connected at their emitters to a second temperature-compensated bias current source; and two second output nodes connected to the collectors of the second bipolar pair for connection to the variable gain amplifier for providing the control currents.

10. The automatic gain controller of claim 9, further comprising a first diode connected to an output of the first voltage-to-current converter and a second diode connected to an output of the second voltage-to-current converter, the first and second diodes connected to a second reference voltage for generating differential voltages for input to first the emitter-coupled bipolar pair.

11. The automatic gain controller of claim 9, wherein the control currents are hyperbolic tangent functions of the input voltage.

12. A method for generating a substantially exponential control current for controlling a variable gain amplifier comprising:

converting an input voltage signal into an input current; and mapping the input current to the control current using a hyperbolic tangent function by processing the input current through a translinear amplifier stage and a bipolar differential pair;

soft-limiting a first domain of the hyperbolic tangent function where the first domain approximates an exponential function of the input voltage signal; and modeling a second domain of the hyperbolic tangent function by a second order function where the second domain deviates from the exponential function by a predetermined range.

13. The method of claim 12, wherein the translinear amplifier includes an emitter-coupled transistor pair, each transistor of the emitter-coupled transistor pair having a collector, and one PMOS current mirror connected to the collector of each transistor.

14. The method of claim 13, wherein each current mirror comprises a gate-coupled FET pair.

15. The method of claim 13, wherein the translinear amplifier includes a forward-biased diode connected at each input of the translinear amplifier for generating a differential voltage for input to the emitter-coupled transistor pair.

16. The method of claim 12, wherein the hyperbolic tangent function is defined by the function $1+\tanh(u)$ having a domain $-\frac{1}{2} < u < \tanh^{-1}(\frac{1}{2})$, and wherein the step of modeling the second order function where the hyperbolic tangent function no longer approximates the exponential function is for the domain $-\infty < u < \tanh^{-1}(\frac{1}{2})$.

17. A gain control circuit for generating a control signal for varying gain in a variable gain amplifier comprising:

a reference current source for generating a reference current;

means for combining the reference current with an input current so that a difference current is generated;

a current amplifier stage for receiving the input current and the difference current and for generating linear differential output current signals therefrom, the current amplifier stage comprising:

a first differential pair connected to the input current and the difference current; and a first and second current mirror connected to the first differential pair;

a current-to-voltage converter stage for converting the differential output current signals into differential output voltage signals; and a second differential pair for receiving the linear differential output voltage signals and generating control currents in response thereto, the control currents each following at least a portion of a hyperbolic tangent function.

* * * * *